(12) United States Patent
deFresart et al.

(10) Patent No.: US 7,602,014 B2
(45) Date of Patent: Oct. 13, 2009

(54) SUPERJUNCTION POWER MOSFET

(75) Inventors: Edouard D. deFresart, Tempe, AZ (US); Robert W. Baird, Gilbert, AZ (US); Ganming Qin, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/109,215

(22) Filed: Apr. 24, 2008

(65) Prior Publication Data

US 2008/0197409 A1    Aug. 21, 2008

Related U.S. Application Data

(62) Division of application No. 11/304,196, filed on Dec. 14, 2005, now Pat. No. 7,378,317.

(51) Int. Cl.
  *H01L 29/76* (2006.01)
  *H01L 21/336* (2006.01)
(52) U.S. Cl. .................. 257/328; 257/135; 257/339; 257/341; 257/342; 257/E29.257; 438/283; 438/303; 438/305; 438/268
(58) Field of Classification Search ............... 257/328, 257/135, 339, 341, 342, E29.257; 438/283, 438/303, 305, 268
See application file for complete search history.

(56) References Cited

U.S. PATENT DOCUMENTS

| | | |
|---|---|---|
| 4,585,517 A | 4/1986 | Stemple |
| 4,754,310 A | 6/1988 | Coe |
| 5,216,275 A | 6/1993 | Chen |
| 5,438,215 A | 8/1995 | Tihanyi |
| 6,097,063 A | 8/2000 | Fujihira |
| 6,097,067 A | 8/2000 | Ouchi et al. |
| 6,291,856 B1 | 9/2001 | Miyasaka et al. |
| 2002/0027237 A1 | 3/2002 | Onishi et al. |
| 2004/0113200 A1* | 6/2004 | Kobayashi et al. .......... 257/328 |
| 2004/0147137 A1 | 7/2004 | Hiraiwa et al. |

FOREIGN PATENT DOCUMENTS

JP    2003008014    6/2001

OTHER PUBLICATIONS

Fujihira, et al., Theory of Semiconductor Superjunction Devices, Jpn. J. Appl. Phys. vol. 36 (1007) pp. 6254-6262.
Zagarzdzon-Wosik, Wanda, "Semiconductor Doping" Wiley Encyclopedia of Electrical and Electronic Engineering, 1999, 22 pgs.

* cited by examiner

*Primary Examiner*—Bradley K Smith
*Assistant Examiner*—Alexander Belousov
(74) *Attorney, Agent, or Firm*—Ingrassia, Fisher & Lorenz, P.C.

(57) ABSTRACT

An embodiment of an MOS device includes a semiconductor substrate of a first conductivity type, a first region of the first conductivity type having a length $L_{acc}$ and a net active dopant concentration of about $N_{first}$, a pair of spaced-apart body regions of a second opposite conductivity type and each having a length $L_{body}$ and a net active dopant concentration of about $N_{second}$, channel regions located in the spaced-apart body regions, source regions of the first conductivity type located in the spaced-apart body regions and separated from the first region by the channel regions, an insulated gate overlying the channel regions and the first region, and a drain region of the first conductivity type located beneath the first region. In an embodiment, $(L_{body} * N_{second}) = k_1 * (L_{acc} * N_{first})$, where $k_1$ has a value in the range of about $0.6 \leq k_1 \leq 1.4$.

5 Claims, 6 Drawing Sheets

SUPERJUNCTION POWER MOSFET

CROSS REFERENCE TO RELATED APPLICATION

This application is a divisional of Ser. No. 11/304,196 filed on Dec. 14, 2005.

TECHNICAL FIELD

The present invention generally relates to field effect transistors (FETS), and more particularly to TMOS type FETS.

BACKGROUND

Field effect transistors (FETS) are widely used today. A common variety are often referred to as metal-oxide-semiconductor (MOS) devices even though the "metal" may be made of other things than simple metals and the "oxide" may also be of other things than simple oxides. Accordingly, as used herein the terms "metal" and "oxide" are intended to include any convenient and stable conductive and insulating materials, respectively. A particular variety of MOS devices useful for power applications are TMOS devices, so called because the current pathway follows a "T" shape.

FIG. 1 illustrates prior art super-junction TMOS device 20. TMOS device 20 is formed in and on substrate 21 having N+ drain region 22 of, for example, 0.01 Ohm-cm resistivity and with thickness $D_{drain}$ of about 350 micrometers thickness, and with its lower surface coupled to drain contact 23. N-Epi region 24 lies above drain region 22 and has thickness Depi typically about 30-50 micrometers. P-body regions 26 extend distance $D_{body}$ about 1-3 micrometers into N-Epi region 24 from upper surface 25 of substrate 21. P+ body contact regions 28 and N+ source regions 30 extend into P− body regions 26 from upper surface 25. N+ source regions 30 have thickness $D_s$ typically about 0.3 micrometers. Gate insulator 32 covered by gate 34 extends between source regions 30 over channel regions 27 in P-body regions 26 and inter-body region 36 located between P-body regions 26. Contact 31 is provided to P+ body contact regions 28 and N+ source regions 30, and connection 35 is provided to gate 34. Beneath P-body regions 26 and extending through N-epi region 24 to drain 22 are P-partition regions 38 of lateral width $L_P$. Beneath inter-body N regions 36 are N-drift regions 39 of depth $D_{drift}$ and of lateral width $L_N$ extending through N-epi region 24 to drain 22. $L_P$ and $L_N$ are typically about 5-8 micrometers. P-partition regions 38 and N-drift regions 39 form a set of substantially equal width vertical channels extending distance $D_{drift}$ from P body regions 26 and inter-body regions 36, respectively, through N-epi layer 24 to N+ drain contact 22, generally a distance of about $D_{drift}$=32-48 micrometers. To obtain super-junction action with prior art device 20, the quantities of impurities in N-drift regions 39 should be within 100% to 150% of the quantity of impurities in P-partition regions 38. When the appropriate bias is applied, current flows from sources 30 to drain 22 as shown by arrows 37. $W_G$ is the gate length and $L_{acc}$ is the length between facing P-body regions 26. Thus, the channel lengths $L_{CH}$ are approximately (½)*($W_G$−$L_{acc}$). In the prior art, $W_G$ is typically of the order of about four micrometers or more and $L_{acc}$ about 2.4 micrometers or more.

While conventional TMOS devices are very useful, they suffer from a number of limitations well known in the art. For example, the on-resistance $R_{DS(ON)}$ is often higher than desired, the gate-source and gate-drain capacitances $C_{GS}$ and $C_{GD}$ are often larger than desired, the gate charge $Q_G$ can be larger than desired, and other device properties may also be less than optimum. While various improvements have been made in the past to attempt to ameliorate these and other problems, such as employing superjunction structures (see for example, U.S. Pat. No. 6,291,856 B1 to Yasushi Miyasaka et al), it has often been the case that what is done to improve one characteristic results in degradation of another important characteristic or substantially increased manufacturing difficulty. For example, while $R_{DS(ON)}$ can be improved by increasing the doping in epi-region 24, this tends to undesirably increase $C_{GD}$ and/or $Q_G$, and/or undesirably reduce the break-down voltage $BV_{DSS}$. Conversely, while $C_{GD}$ and $Q_G$ can be reduced by thickening the gate oxide above region 36 this tends to increase $R_{DS(ON)}$ and/or undesirably perturb the threshold voltage. While use of a superjunction structure like that shown in FIG. 1 may avoid some of these complications by forming charge balanced drift region 38, 39, it is difficult and expensive to fabricate the required side-by-side arrangement of P and N closely packed parallelepipeds 38, 39 whose heights ($D_{drift}$) are generally 4-5 times their width ($L_P$, $L_N$), such as is illustrated in FIG. 1. For higher frequency operation when lateral device dimensions (e.g., $W_G$, $L_P$, $L_N$, etc.) generally must be made smaller, this is even more difficult to accomplish since smaller values of $L_P$ and $L_N$ are often associated with larger values of $D_{drift}$. The greater the aspect ratio (e.g., $L_N/D_{drift}$) the more difficult and expensive it is to fabricate the devices, especially larger area devices also adapted to handle higher currents. These and other factors combine to limit the ability of conventional devices to switch large amounts of power at higher speeds. Thus, there is an ongoing need for MOS devices whose structure and mode of manufacture avoids these and other difficulties. Accordingly, it is desirable to provide MOS devices having both higher current and higher switching speeds. In addition, it is desirable the changes in device structure and method of fabrication used to improve the devices be compatible with existing device manufacturing techniques, especially with planar technology. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
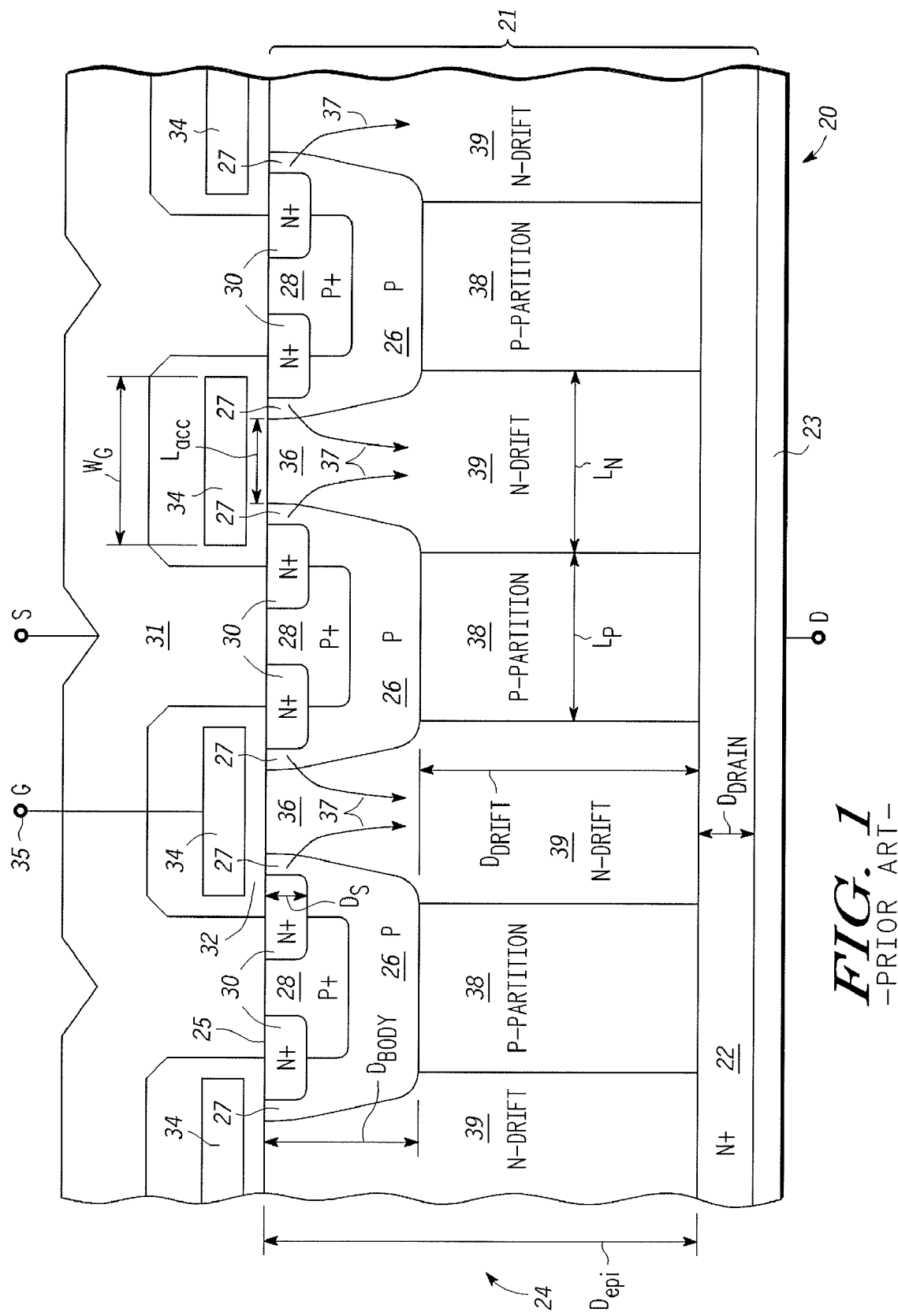
FIG. 1 is a simplified schematic cross-sectional view through a superjunction TMOS device according to the prior art.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

MOS devices may be P-channel type devices referred to as PMOS devices or N-channel type devices, referred to as NMOS devices. This invention relates usefully to NMOS devices and is described herein for such structures. However, this is for convenience of illustration and not intended to be limiting and the principles taught herein also apply to PMOS devices. Thus, as used herein the terms "P-type" and "N-type" are intended to be equivalent to and include the more general terms "first conductivity type" and "second conductivity type" respectively, where "first" and "second" can refer to either P or N conductivity types. Further, where $N_a$ refers to the number of acceptors per unit volume and $N_d$ refers to the number of donors per unit volume, persons of skill in the art will understand based on the description herein that the more general descriptors $N_{first}$ and $N_{second}$ may be used to refer to the number of donor or acceptor per unit volume, where "first" and "second" can refer to either donors or acceptors. Also as noted above, the terms "metal" and "oxide" and metal-oxide-semiconductor and the abbreviation "MOS" are intended to include any reasonably stable conductive and insulating materials, respectively, such as those described herein, but not limited thereto.

Figure 2:
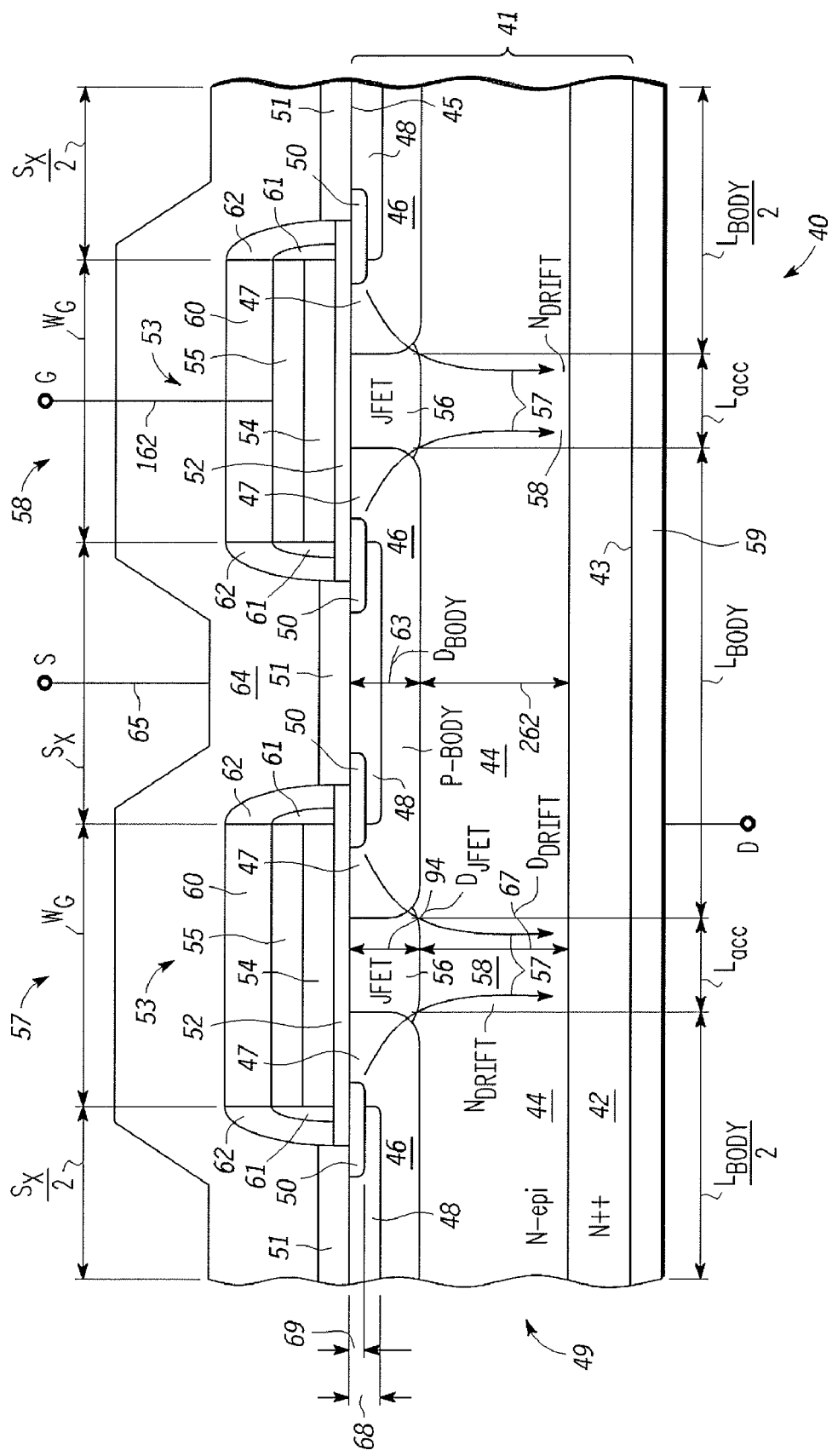
FIG. 2 is a simplified schematic cross-sectional view through a superjunction TMOS device according to an embodiment of the present invention.

FIG. 2 is a simplified schematic cross-sectional view through TMOS device 40 according to an embodiment of the present invention. Device 40 comprises substrate 41, conveniently of silicon but other semiconductors may also be used, having lower surface 43 and upper surface 45. N++ drain region 42, of typically 0.004 Ohm-cm resistivity, is generally provided at or adjacent lower surface 41. Drain contact 59 is conveniently provided on lower surface 43 of N++ drain region 42 with connection D. However, this is not intended to be limiting since drain region 42 can be contacted from either lower surface 43 or if formed as a buried layer be contacted from upper surface 45. N-Epi region 44 extends upwardly from N++ drain region 42. P-body regions 46 extend downwardly into N-Epi region 44 from upper surface 45 and are laterally separated by distance $L_{acc}$. P++ body contact regions 48 and N++ source regions 50 extend into P-body regions 46. Gate dielectric 52 (e.g., of silicon dioxide) overlies surface 45 above channel regions 47 and above so-called JFET region 56, and also conveniently extends slightly over source regions 50. Conductive gate electrode 53 of width $W_G$ overlies gate dielectric 52. Gate electrode 53 is desirably a composite sandwich wherein layer 54 is conveniently of doped polysilicon and layer 55 is conveniently of a polycide such as, for example, tungsten-silicide $WSi_x$ where, generally, $1.5 \leq x \leq 2$, but other composition ranges and other polycides can also be used. The combination of poly-Si layer 54 and polycide layer 55 provides low gate resistance, which assists in obtaining good switching speed. External gate contact 162 is remotely provided to gate electrode 53. Dielectric layer 60 (e.g., of silicon oxide) is provided over gate electrode 53 so that source and body contact metallization 64 of, for example, Al, Cu, Au, Si and/or alloys thereof may bridge over gate electrode 53 above active channel regions 47 and JFET region 56, and be coupled to source regions 50 and body region contacts 48 on either side of gate electrode 53. Al with a trace of Cu is preferred for metallization 64 but this is not intended to be limiting. For convenience of description, the abbreviation "Al:Cu" used herein in referring to metallization 64 is intended to refer not only to the preferred combination but also to the many other possible metal combinations that can be used, including but not limited to those listed above. External contact 65 is made remotely to source metallization 64.

It is preferred but not essential to provide conductive barrier material 51 of, for example, Ti/TiN or other conductive intermetallic, between source and body contact regions 50, 48 and source/body metallization 64 to retard inter-diffusion of polycide 55 and metallization 64. This helps maintain low resistance connection to source/body contact regions 50, 48. As noted above, other conductive materials may be used for source/body metallization 64. Alternatively, metallization 64 may be applied directly to source/body contact regions 50, 48, but this is less desirable. Side-wall spacers 61, 62 are provided to separate the lateral edges of gate electrode 53 from source/body contacts 51 and source/body metallization 64. The channel lengths $L_{CH}$ are approximately $(\frac{1}{2})^*(W_G - L_{acc})$. In a preferred embodiment, $L_{acc}$ and $L_{CH}$ (channel 47) are each of the order of about 0.2-0.3 microns so that $W_G$ is of the order of about 0.6-1.0 micrometers or less. However, $L_{acc}$ can be less than 0.2 micrometers. Using small values of $L_{acc}$ and $W_G$ can substantially enhance the high speed switching performance. When appropriately biased, current flows from sources 50 to drain 42 through $N_{DRIFT}$ region 58 as indicated by arrows 57. It has been found that by reducing the value of $W_G$ to the order of 1-2 micrometers and $L_{acc}$ to less than a micrometer, and carefully controlling the doping in JFET regions 56 and P-body regions 46 as described more fully in connection with FIGS. 3-12, that devices having superior performance can be obtained, without compromising the breakdown voltage $BV_{DSS}$ and without the burden of forming deep narrow P-partition and N-drift pillars 38, 39 such as are utilized in device 20 of FIG. 1. For example, analysis of the structure of FIG. 2 indicates that the resistance of JFET region 56 can be reduced by about fifty percent or more, which is expected to result in at least a twenty-five percent reduction in $R_{DS(ON)}$, other things being equal. Further, this improvement can be achieved without adversely affecting $BV_{DSS}$ or Qg. In addition, desirable trade-off flexibility between Qg and $R_{DS}$ $_{(ON)}$ is available. For example, if maximum switching speed is most important, one can use minimum device dimensions, thereby obtaining lower Qg for the same $R_{DS(ON)}$ or, alternatively, when low loss is most important (e.g., for very high currents), one can use larger dimensions to obtain lower $R_{DS}$ $_{(ON)}$ for the same Qg, all without adversely affecting $BV_{DSS}$. Thus, not only is the overall performance improved, but advantage can be taken of the ability to trade-off speed and power handling capability to design devices optimized for particular applications. This is a significant improvement over the prior art.

Figure 3:
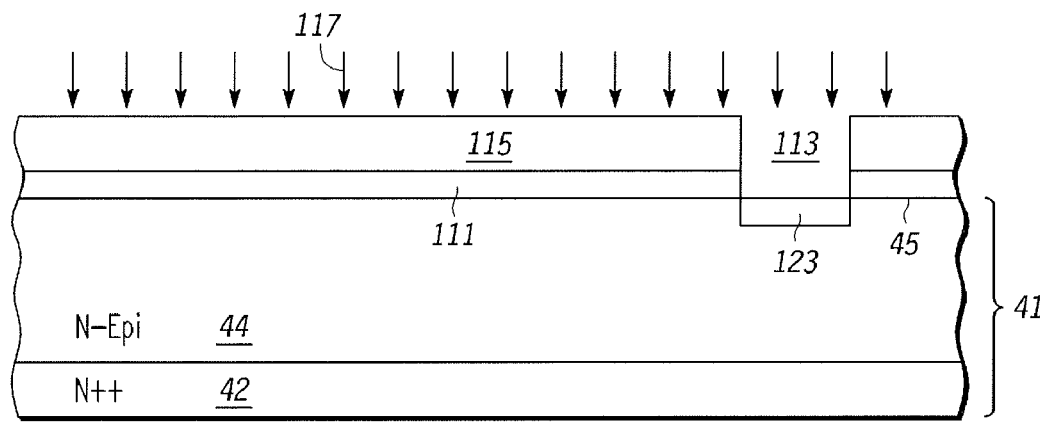
FIGS. 3-12 are simplified schematic cross-sectional views showing further detail and according to further embodiments of the present invention, illustrating sequential steps in methods of fabricating devices of the type illustrated in FIG. 2.
Figure 4:
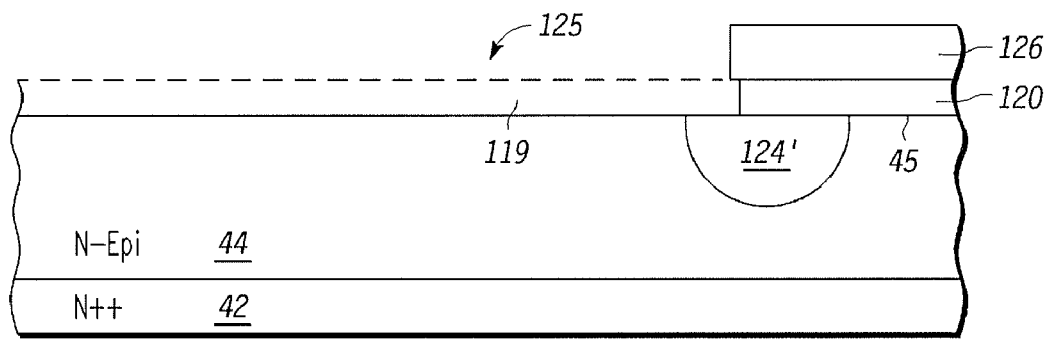

FIGS. 3-12 are simplified schematic cross-sectional views showing further detail and according to further embodiments of the present invention, illustrating sequential steps 101-110 of methods of fabricating device 40 of FIG. 2. FIG. 3 shows sequential step 101 wherein there is provided semiconductor wafer or substrate 41 of preferably silicon and comprising N++ doped layer 42 surmounted by N-type layer 44. The combination of highly doped layer 42 surmounted by substantially uniformly doped layer 44 may be achieved in various ways well known in the art. For example, layer 42 may be the starting substrate on which layer 44 is formed by epitaxial growth or layer 44 may be the starting substrate in which layer 42 is formed by doping or other means. Or, layer or region 42 may a buried layer provided within layer 44 at a predetermined depth and contacted by a highly doped sinker region from surface 45 or elsewhere. Either arrangement is useful. Layer 44 is preferably an epi-layer but this is not essential, and the identification of layer 44 on FIGS. 3-12 as an "N-Epi" layer is merely by way of example and not intended to be limiting. Layer 42 is conveniently arsenic doped to about 0.004 Ohm-cm, but larger or smaller doping levels may also be used. Layer 44 is conveniently phosphorous doped to about 0.1 to 1.0 Ohm-cm with about 0.3 Ohm-cm being preferred, but higher and lower doping can also be used. Layer 44 is preferably about 3-4 micrometers in thickness, but thinner or thicker layers can also be used. Initial oxide layer 111, typically of a few thousand Angstrom units thickness, is provided on upper surface 45. Mask layer 115 of, for example, photoresist is applied on initial oxide layer 111 and patterned to provide opening 113 extending to semiconductor surface 45. P-type edge region 123 is introduced into N-type layer 44 through opening 113, thereby providing the structure illustrated in FIG. 3. Ion implantation 117 utilizing boron is a preferred doping method but other doping arrangements well known in the art for providing P-type edge region 123 may also be used. Persons of skill in the art will understand that FIGS. 3-12 show only a portion of the device structure being fabricated and that further doped regions (not shown) analogous to doped region 123 may be provided elsewhere in substrate 41. In step 102 of FIG. 4, mask layer 115 is removed, and field oxide layer 120 grown or otherwise formed to a thickness about twice that of initial oxide layer 111, but larger or smaller thickness values may also be used. Mask layer 126 is applied and patterned to expose portion 119 of field oxide layer 120. Portion 119 is conveniently removed by etching via opening 125 in mask layer 126. The higher temperatures encountered during deposition or growth of field oxide 120 cause initial edge region 123 to diffuse downwardly and laterally in N-layer 44, thereby providing expanded P-type edge region 124', as shown in FIG. 4.

Figure 5:
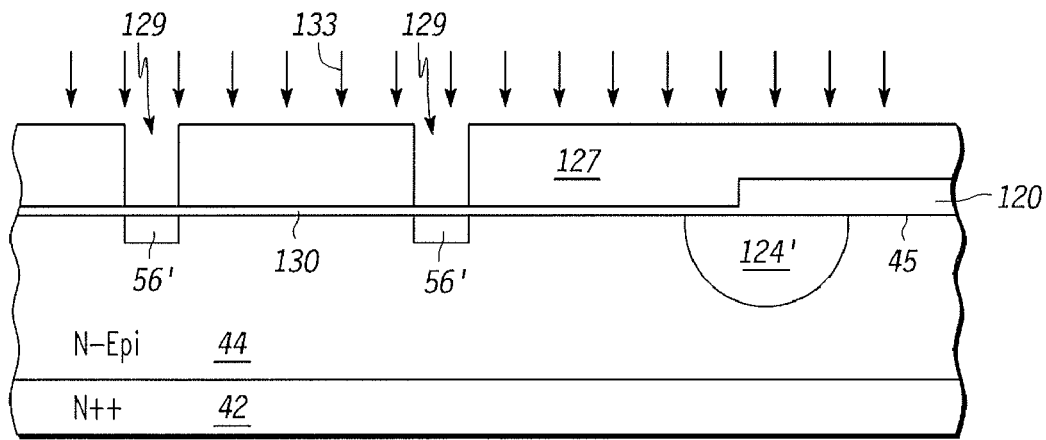
Figure 6:
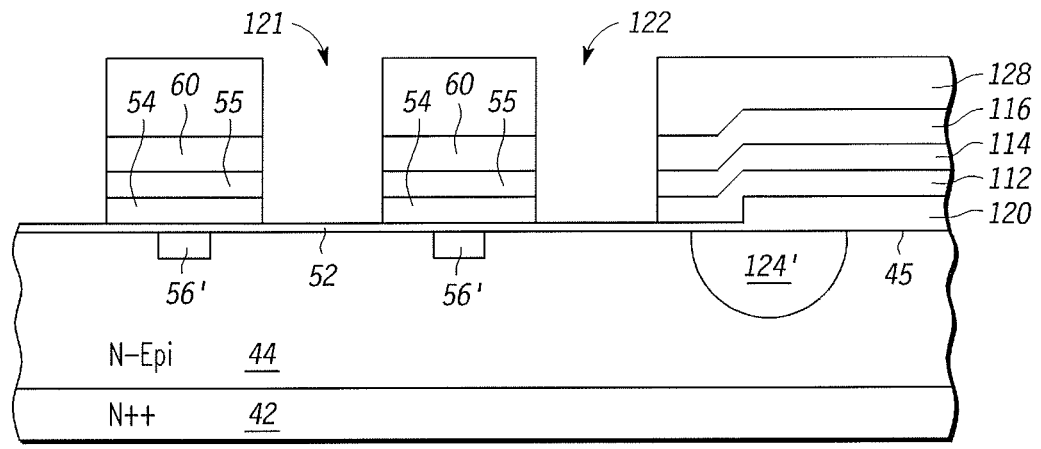
Figure 7:
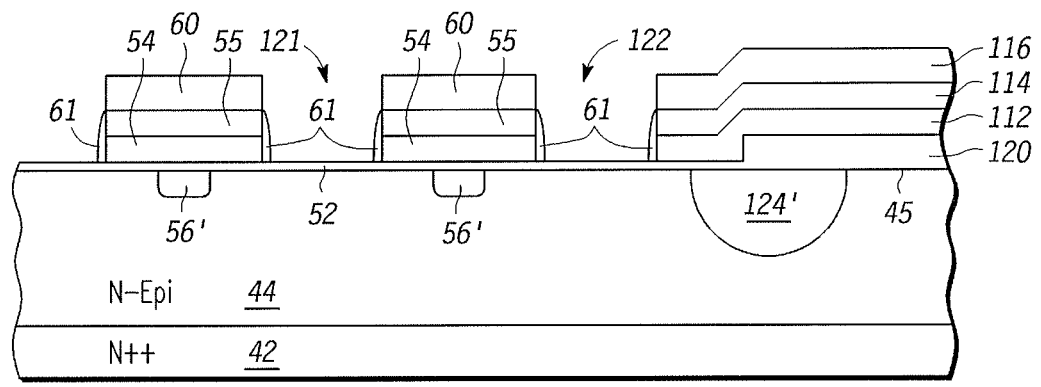
Figure 8:
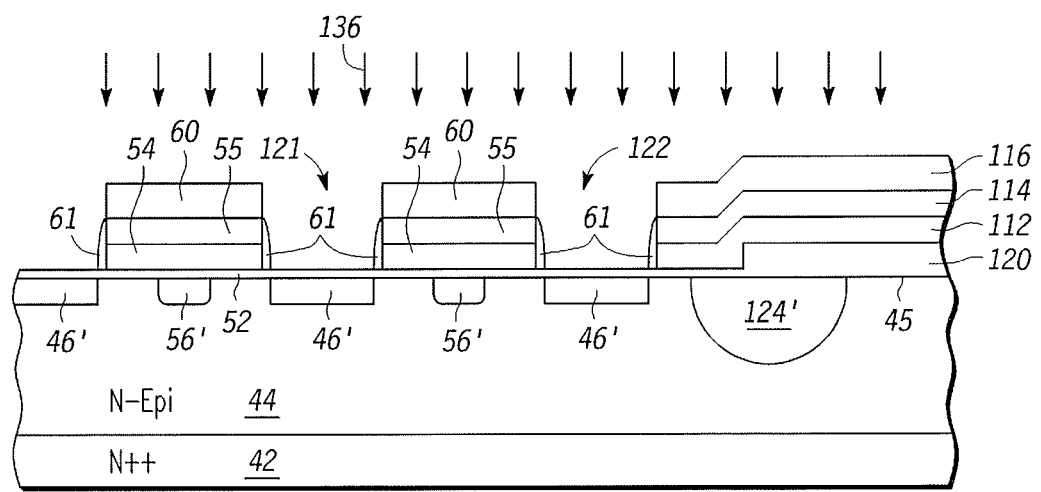
Figure 9:
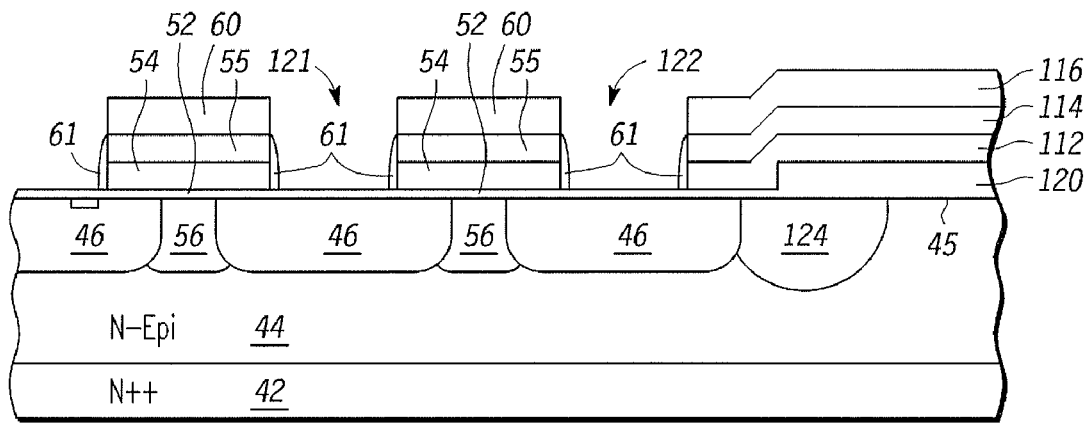

In step 103 of FIG. 5, screen oxide 130 is formed on surface 45 and masking layer 127 of, for example, photoresist, is conveniently provided over screen oxide 130 and field oxide 120 and patterned to have openings 129 where N-doped regions 56 are desired to be located. N-type implant 133 is provided to form initial N-doped regions 56' in N-epi layer 44 under mask openings 129. A dose about 1E13 to 1E14 atoms per sq cm is convenient with about 3E13 atoms per sq cm being preferred. Implant energies in the range of about 100-350 keV are convenient with about 200 keV being preferred.

Referring now to FIGS. 6-12, in step 104 screen oxide 130 is preferably removed by a brief etch and gate oxide 52 is conveniently formed in its place, but this is not essential and screen oxide 130 may also serve as the gate oxide. Gate oxide 52 is preferably formed by thermal growth to a thickness depending upon the desired voltage capabilities and gate capacitance of the device. Gate oxide thicknesses in the range of 100-500 Angstroms units are convenient with thicknesses in range of 350-500 Angstrom units being preferred for higher voltage power devices, but larger or smaller thicknesses can also be used. Polysilicon or other blanket polycrystalline semiconductor (SC) layer 112 is provided over oxide layers 120, 52. Then blanket polycide layer 114 of, for example, tungsten-silicide $WSi_x$ where $1.5 \leq x \leq 2$ or other polycide, is provided over poly-SC layer 112. Then blanket dielectric layer 116 of, for example, silicon dioxide is provided over polycide layer 114. Layers 112, 114, 116 are conveniently but not essentially formed by chemical vapor deposition (CVD) or plasma enhance chemical vapor deposition (PECVD). However, other formation techniques may also be used. Sputtering and evaporation are non-limiting examples of alternative deposition methods for any and all of layers 112, 114, 116. The thicknesses of conductive layers 112, 114 should be chosen in conjunction with the choice of materials for these layers so as to provide relatively low resistance gate electrodes 53. In general, thicknesses of the order of a few thousand Angstrom units are convenient. The thickness of dielectric layer 116 is chosen by the device designer so as to limit capacitive coupling between the source and gate conductors (see FIG. 2) to acceptable levels without producing an overly thick device superstructure. Persons of skill in the art will understand how to make such choices. Masking layer 128 of, for example, photoresist, is applied over dielectric layer 116 and patterned to provide openings 121, 122 wherein underlying portions of layers 112, 114, 116 are removed, conveniently by etching, thereby producing the structure of FIG. 6. Layers 112, 114, 116 correspond to layers 54, 55, 60 of FIGS. 2 and 12. In step 105 of FIG. 7, masking layer 128 is removed and sidewall oxidation performed to form first side-wall spacers 61 on exposed lateral edges of poly-SC layer 112 and polycide layer 114. In the course of this thermal oxidation step to form first sidewall spacers 61, buried doped regions 56' diffuse outwardly somewhat. In step 106 of FIG. 8, P-type implant 136 of, for example, boron is provided through openings 121, 122 to a dose usefully in the range of about 1E12 to 1E13 atoms per sq cm at energies in the range of about 40 to 100 KeV, with a dose of about 6E12 atoms per sq cm at energies in the range of about 60 KeV being preferred. Implant 136 forms doped regions 46' beneath openings 121, 122, thereby providing the structure illustrated in FIG. 8. It is desirable to use a range of energies so as to achieve the substantially uniform doping eventually desired for P-body regions 46 which form from implanted regions 46'. In step 107 of FIG. 9, a high temperature drive is provided at, for example, about 900 to 1200 degrees centigrade, with about 950 to 1100 degrees centigrade for about 70 minutes being preferred. Drive step 107 redistributes the various N and P dopants so that P-doped regions 46' expand to form P-doped body regions 46, N-doped regions 56' expand further to form JFET regions 56, and region 124' expands further to form P-edge region 124 of FIGS. 2 and 12.

Figure 10:
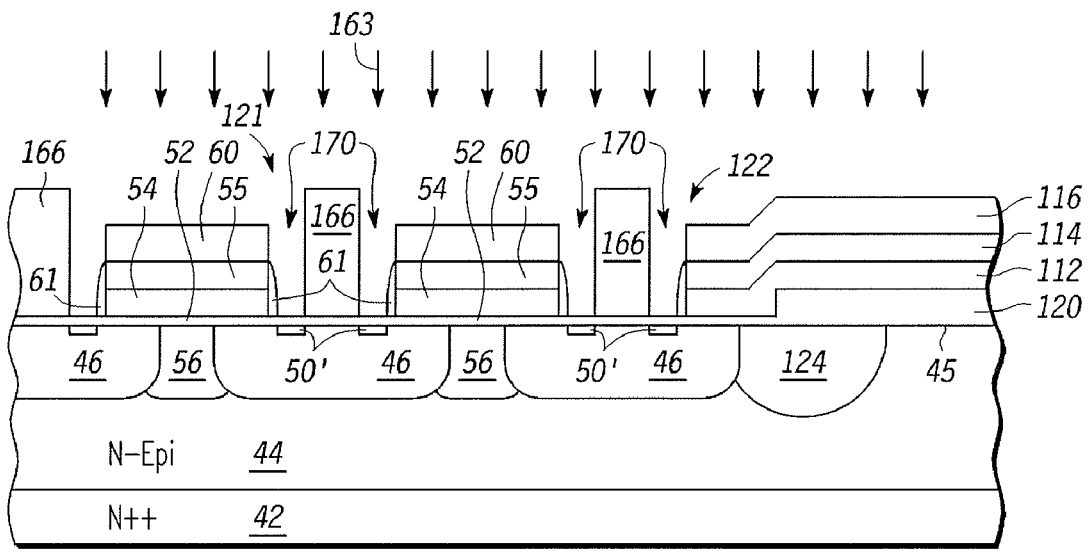
Figure 11:
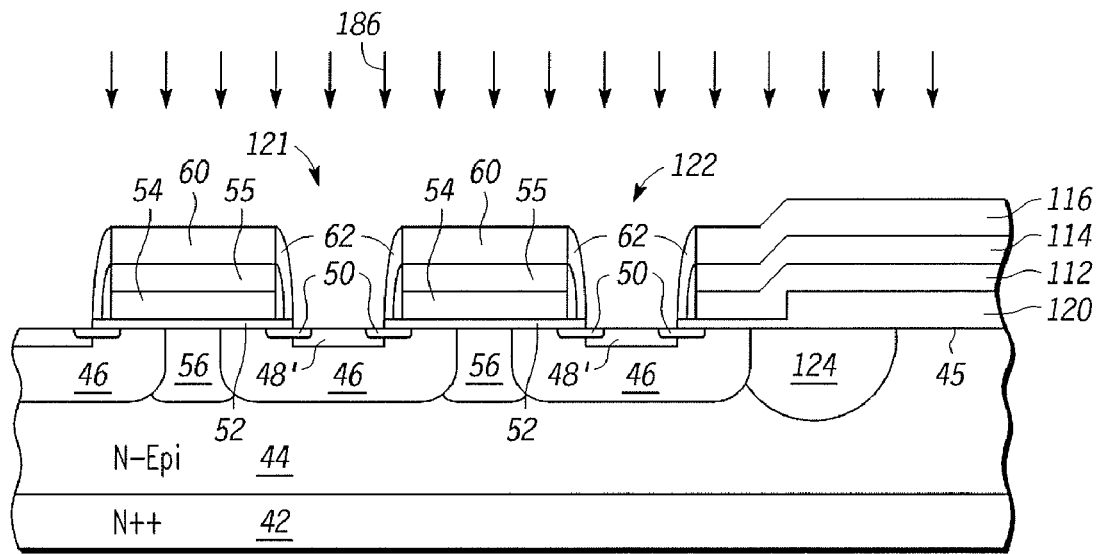

In step 108 of FIG. 10, mask regions 166 located approximately centrally in openings 121, 122 are provided, thereby leaving openings 170 between mask regions 166 and first side-wall spacers 61. Then, N+ implant 163 of, for example, arsenic is applied at an energy usefully in the range of about 40 to 120 keV to a dose usefully in the range of about 1E15 to 5E15 atoms per sq cm, preferably at about 90 keV to a dose of about 4E15 atoms per sq cm. Implant 163 is conveniently carried out through oxide layer 52 to form source regions 50', as shown in FIG. 10. While ion implantation is preferred, other doping means well known in the art may also be used. In step 109 of FIG. 11, a blanket layer of dielectric such as, for example, silicon oxide, is deposited over the structure of FIG. 10 (e.g., by CVD, PECVD, evaporation or sputtering) and then differentially etched using means well known in the art to provide second side-wall spacers 62 on the lateral edges of layers 112, 114, 116 and first sidewall spacers 61 in openings 121, 122. This anisotropic etch also removes oxide layer 52 in openings 121, 122 between sidewall spacers 62. Then, P-type implant 186 is provided into surface 45 through openings 121, 122 to form P-type regions 48'. Any convenient P-type dopant may be used but boron is preferred. Implant 186 is usefully carried out at energies in the range of about 20 to 60 keV to a dose of about 5E14 to 5E15 atoms per sq cm. An energy of about 40 keV and a dose of about 1E15 atoms per sq cm are preferred. This provides the structure illustrated in FIG. 11.

Figure 12:
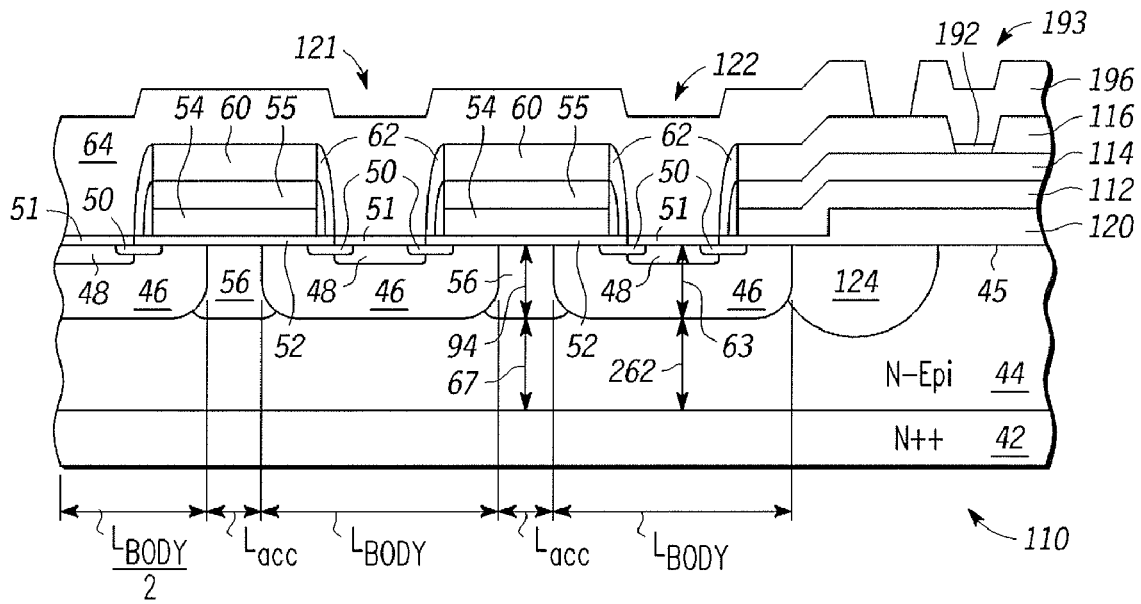

In step 110 of FIG. 12, opening 193 is etched through dielectric layer 116 to permit contact to polycide layer 114. Then an inter-metallic conductive barrier layer is deposited through openings 121, 122 and 193, masked and etched to leave inter-metallic barrier regions 51 in contact with source regions 50 and body contact region 48 under openings 121, 122, and inter-metallic barrier region 192 in contact with polycide layer 114 under opening 193. Then layer 64 of Al:Cu or other highly conductive material is deposited over the structure and masked and etched to provide source/body metallization 64 in contact with conductive barrier layer regions 51 and gate lead 196 in contact with conductive barrier layer region 192, as shown in FIG. 12. The structure illustrated in FIG. 2 is then substantially complete. In addition, FIG. 12 illustrates how connection is usefully made to gate metallization 53. Persons of skill in the art will understand that conductive regions 112, 114 under gate contact 196 are electrically coupled to regions 54, 55 outside the plane of FIGS. 2 and 13.

Referring now to FIGS. 2 and 12, the benefits of the present invention are best achieved when the product of the length $L_{body}$ of P-body region 46 times the net active acceptor concentration $N_a$ per unit volume in such region, substantially equals the product of the length $L_{acc}$ of JFET region 56 times the net active donor concentration $N_d$ per unit volume in region 56, that is, when $(L_{body}*N_a)=k_1*(L_{acc}*N_d)$, where $L_{body}$ and $L_{acc}$ are measured in the same units and $k_1$ is a dimensionless parameter. $k_1$ is usefully in the range of about $0.6 \leq k_1 \leq 1.4$, conveniently in the range $0.8 \leq k_1 \leq 1.2$, desirably in the range of about $0.9 \leq k_1 \leq 1.1$ and preferably about $k_1 \sim 1.0$. It is also desirable that depth 94 (hereafter $D_{JFET}$) of JFET region 56 and depth 63 (hereafter $D_{body}$) of P-body region 46 be about equal, that is $D_{body}=k_2*D_{JFET}$ where $k_2$ is a dimensionless constant desirably in the range $0.8 \leq k_2 \leq 1.2$ and preferably in the range of about $0.9 \leq k_2 \leq 1.1$. It is further desirable that the doping in regions 56 and 46 be substantially constant as a function of depth into region 44 for most of depths 94, 63, that is, that the slope $dN_a/dy=k_3$ be in the range of about $3E20 \leq k_3 \leq 5E20$ atoms/cm$^4$ over at least about half of the depth of P-body 46 and the slope $dN_d/dy=k_4$ be in the range of about $2E20 \leq k_4 \leq 4E20$ atoms/cm$^4$ over at least half of the depth of N-type JFET region 56, where y measures the distance from surface 45. The foregoing conditions are accomplished by suitably adjusting the energy and dose of implant 133 in step 103 of FIG. 5, the energy and dose of implant 163 of step 108, and the thermal processing associated with at least steps 104-107 and/or otherwise performed during fabrication of device 40. The implants and thermal processing that best achieve the condition $(L_{body}*N_a)=k_1*(L_{acc}*N_d)$ for the ranges of $k_1$ described above, will depend upon the particular impurity dopants chosen by the device designer. Such adjustments are within the competence of persons of skill in the art based on the teachings herein, without undue experimentation. It should be noted that the charge equality condition $(L_{body}*N_a)=k_1*(L_{acc}*N_d)$ applies substantially only in the near surface regions of device 40, that is in P-body 46 and JFET region 56, and is not required in portion 49 (of depth 262, 67) of N-epi region 44 overlying drain region 42 beneath P-body regions 26 and JFET regions 56. Thus, the complex arrangement of parallelepipeds of P-partition regions 38 and N-drift regions 39 used in prior art device 20 are not needed. It will be further noted that device 40 can be fabricated substantially entirely using available planar fabrication technology. The more complex trench and refill techniques often associated with prior art devices such as device 20 of FIG. 1 are not required. This is a further substantial advantage of the present invention.

According to a first embodiment, there is provided an MOS device comprising a semiconductor substrate of a first conductivity type and having a first principal surface, a first region of the first conductivity type extending a first distance into the substrate from the first principal surface and of length $L_{acc}$ in a directions substantially parallel to the first principal surface and having a net active dopant concentration of about $N_{first}$, at least a pair of spaced-apart body regions of a second opposite conductivity type extending a second distance into the substrate from the first principal surface and separated by the first region of the first conductivity type and each having length $L_{body}$ in a direction substantially parallel to the first principal surface and having a net active dopant concentration of about $N_{second}$, channel regions located in the spaced-apart body regions substantially at the first surface and extending to the first region, source regions of the first conductivity type located substantially at the first surface in the spaced-apart body regions and separated from the first region by the channel regions, an insulated gate located above the first surface overlying the channel regions and the first region, a drain region of the first conductivity type located in the substrate beneath the first region, and wherein $(L_{body}*N_{second})=k_1*(L_{acc}*N_{first})$, where $k_1$ has a value in the range of about $0.6 \leq k_1 \leq 1.4$. According to a further embodiment, $k_1$ has a value in the range of about $0.8 \leq k_1 \leq 1.2$. According to a still further embodiment, $k_1$ has a value in the range of about $0.9 \leq k_1 \leq 1.1$. According to a yet further embodiment, the first distance has a value of $D_{body}$ and second distance has a value of $D_{JFET}$ and $D_{body}=k_2*D_{JFET}$ where $k_2$ is desirably in the range $0.8 \leq k_2 \leq 1.2$. According to a yet still further embodiment, $k_2$ is desirably in the range $0.9 \leq k_2 \leq 1.1$. According to another embodiment, the active net dopant concentration $N_{second}$ in at least some of the body regions be such that a slope $dN_{second}/dy=k_3$ be in the range of about $3E20 \leq k_3 \leq 5E20$ atoms/cm$^4$ over at least about half of the depth of the body regions. According to a yet another embodiment, the active net dopant concentration $N_{first}$ in the adjacent first region be such that a slope $dN_{first}/dy=k_4$ be in the range of about $2E20 \leq k_4 \leq 4E20$ atoms/cm$^4$ over at least half of the depth of the body regions.

According to a second embodiment, there is provided an MOS device made by a process comprising, providing a substrate of a first conductivity type, forming a drain region of a first conductivity type in the substrate, forming multiple first regions of the first conductivity type at a first surface and of first length $L_{acc}$ measured substantially parallel to the first surface, and separated from the drain region, and extending into the substrate a first distance $D_{JFET}$, and having net active dopant concentration $N_{first}$ in at least some of said multiple regions, forming in the substrate at the first surface, multiple body regions of second length $L_{body}$ measured substantially parallel to the first surface and of a second, opposite conductivity type, and extending from the first surface into the substrate a second distance $D_{body}$, and having net active dopant concentration $N_{second}$ in at least some of said multiple body regions, wherein spaced-apart pairs of said body regions are separated by the first region, wherein for at least a pair of said multiple body regions and an intervening first region, the relationship $(L_{body}*N_{second})=k_1*(L_{acc}*N_{first})$ is satisfied, where $k_1$ has a value in the range of about $0.6 \leq k_1 \leq 1.4$. According to a further embodiment, the method of forming the first region further comprises implanting dopant ions of the first conductivity type into the first region. According to a yet further embodiment, the method of forming the first region further comprises implanting said dopant ions using more than one implant energy. According to a still further embodiment, the method of forming the multiple body regions further comprises implanting dopant ions using more than one implant energy. According to a still yet further embodiment, $D_{body}=k_2*D_{JFET}$ where $k_2$ is desirably in the range $0.8 \leq k_2 \leq 1.2$. According to a yet still further embodiment, a region between $D_{body}$ and $D_{JFET}$ and the drain region is of a single conductivity type. According to another embodiment, $L_{acc}$ is $\leq$ about 0.3 micrometers. According to a yet another embodiment, $L_{acc}$ is $\leq$ about 0.2 micrometers.

According to a third embodiment, there is provided an MOS device, which includes multiple N-type source regions, electrically in parallel, located in multiple P-body regions separated by N-type JFET regions at a first surface. The gate overlies the body channel regions and the JFET region lying between the body regions. The JFET region communicates with an underlying drain region via an N-epi region. Ion implantation and heat treatment are used to tailor the net active doping concentration $N_d$ in the JFET region of length $L_{acc}$ and net active doping concentration $N_a$ in the P-body regions of length $L_{body}$ so that a charge balance relationship $(L_{body}*N_a)=k_1*(L_{acc}*N_d)$ between P-body and JFET regions is satisfied, where $k_1$ is in a range of about $0.6 \leq k_1 \leq 1.4$. The entire device can be fabricated using planar technology and the charge balanced regions need not extend through the underlying N-epi region to the drain.

According to a fourth embodiment, there is provided an MOS device, which includes a semiconductor substrate of a first conductivity type having an upper surface, a first doped region of the first conductivity type that extends downwardly from the upper surface, a gate overlying the first doped region and having a gate dielectric on the upper surface, an overlying dielectric layer on the gate dielectric, and a gate conductor, and second doped regions of a second opposite conductivity type extending downwardly from the upper surface and formed in the substrate beyond the lateral extent of the gate. The lateral extent of the gate extends beyond the first doped region and over portions of the semiconductor substrate underlying the gate and adjacent to the first doped region at the upper surface, and the first doped region and the second doped regions meet under the gate, and the net active impurity concentration $N_{first}$ in the first doped region of lateral length $L_{first}$ and the net active impurity concentration $N_{second}$ in the second doped regions of lateral length $L_{second}$ satisfy a first relationship $(N_{second}*L_{second})=k_1*(N_{first}*L_{first})$, where $k_1$ has a value in the range of about $0.6 \leq k_1 \leq 1.4$, and also satisfy a second relationship that a depth of the first doped region is about equal to a depth of the second doped regions.

While at least one exemplary embodiment has been presented in the foregoing detailed description, it should be appreciated that a vast number of variations exist. For example, while the present invention has been described in the context of NMOS type devices, this is merely for convenience of explanation and not intended to be limiting. With appropriate substitutions of conductivity types as will be understood by persons of skill in the art, PMOS devices can also be constructed utilizing the teachings described herein. Accordingly, the more general terms "first" and "second" with reference to conductivity types are intended to refer to either N or P type dopants, and similarly $N_{first}$ and $N_{second}$ refer to doping concentrations of first and second types of dopants respectively, where "first and "second" also indicate either N or P type dopant atoms. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A metal oxide semiconductor (MOS) device, comprising:
   a semiconductor substrate of a first conductivity type having an upper surface;
   a first doped region of the first conductivity type that extends downwardly from the upper surface;
   a gate overlying the first doped region and having a gate dielectric on the upper surface, an overlying dielectric layer on the gate dielectric, and a gate conductor, wherein a lateral extent of the gate extends beyond the first doped region and over portions of second doped regions that are laterally adjacent to the first doped region at the upper surface;
   the second doped regions of a second opposite conductivity type extending downwardly from the upper surface and initially formed in the substrate beyond the lateral extent of the gate, wherein the first doped region and the second doped regions meet under the gate after exposure to a high temperature drive process, and wherein a charge equality condition is present in the first doped region and the second doped regions because a net active impurity concentration $N_{first}$ in the first doped region of lateral length $L_{first}$ and a net active impurity concentration $N_{second}$ in the second doped regions of lateral length $L_{second}$ satisfy a first relationship $(N_{second}*L_{second})=k_1*(N_{first}*L_{first})$, where $k_1$ has a value in a range of about $0.6 < k_1 < 1.4$, and also satisfy a second relationship that a depth of the first doped region is about equal to a depth of the second doped regions; and
   a drain region of the first conductivity type located in the semiconductor substrate beneath the first doped region and the second doped regions, wherein the drain region is separated from the first doped region and the second doped regions by a portion of the semiconductor substrate that overlies the drain region and is beneath the first doped region and the second doped regions, and wherein the charge equality condition is not present in the portion of the semiconductor substrate that overlies the drain region and is beneath the first doped region and the second doped regions.

2. The device of claim 1, further comprising:
first dielectric spacers on lateral edges of the gate conductor.

3. The device of claim 1, further comprising:
source regions of the first conductivity type in the second doped regions.

4. The device of claim 3, further comprising:
body contact regions of the second conductivity type in the second doped regions, wherein the body contact regions are located between the source regions.

5. The device of claim 4, further comprising:
an electrically conductive barrier layer material on the source regions and the body contact regions.

* * * * *